US008287336B2

(12) United States Patent
Dangler et al.

(10) Patent No.: US 8,287,336 B2
(45) Date of Patent: Oct. 16, 2012

(54) METHOD OF MANUFACTURING A VENTING DEVICE FOR TAMPER RESISTANT ELECTRONIC MODULES

(75) Inventors: John Richard Dangler, Rochester, MN (US); Phillip Duane Isaacs, Rochester, MN (US); Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1363 days.

(21) Appl. No.: 11/686,102

(22) Filed: Mar. 14, 2007

(65) Prior Publication Data
US 2007/0155302 A1 Jul. 5, 2007

Related U.S. Application Data

(62) Division of application No. 10/981,021, filed on Nov. 4, 2004, now Pat. No. 7,214,874.

(51) Int. Cl.
*H05K 5/00* (2006.01)
(52) U.S. Cl. ....................................................... 454/184
(58) Field of Classification Search ................... 454/184; 29/623.5; 428/847.4; 361/690, 695; 429/16
See application file for complete search history.

(56) References Cited

U.S. PATENT DOCUMENTS

| | | | | |
|---|---|---|---|---|
| 2,819,006 A * | 1/1958 | Magill et al. | ............. | 229/5.5 |
| 3,214,324 A * | 10/1965 | Peerman | ............. | 442/85 |
| 3,449,193 A * | 6/1969 | Bratton et al. | ............. | 156/87 |
| 3,637,101 A * | 1/1972 | Risch et al. | ............. | 215/347 |
| 3,798,103 A * | 3/1974 | Gaunt | ............. | 156/244.24 |
| 3,870,566 A * | 3/1975 | Bergum et al. | ............. | 429/82 |
| 4,105,831 A * | 8/1978 | Plasse | ............. | 429/86 |
| 4,323,620 A * | 4/1982 | Iwabuchi et al. | ............. | 428/215 |
| 4,361,633 A * | 11/1982 | Nel et al. | ............. | 429/162 |
| 4,446,188 A * | 5/1984 | Patel et al. | ............. | 428/138 |
| 4,461,800 A * | 7/1984 | Tanaka | ............. | 428/217 |
| 4,489,123 A * | 12/1984 | Schijve et al. | ............. | 428/213 |
| 5,390,412 A * | 2/1995 | Gregoire | ............. | 29/848 |
| 5,390,967 A | 2/1995 | Gooderham et al. | | |
| 5,406,630 A | 4/1995 | Piosenka et al. | | |
| 5,545,455 A * | 8/1996 | Prevorsek et al. | ............. | 428/76 |
| 6,015,607 A * | 1/2000 | Fraivillig | ............. | 428/214 |
| 6,207,242 B1 * | 3/2001 | Hoffman | ............. | 428/34.2 |
| 6,412,485 B1 | 7/2002 | Saieva | | |
| 6,431,212 B1 * | 8/2002 | Hayenga et al. | ............. | 137/855 |
| 6,970,360 B2 | 11/2005 | Sinha | | |

FOREIGN PATENT DOCUMENTS

| | | |
|---|---|---|
| EP | 0322515 A2 | 7/1989 |
| JP | 08218596 A * | 8/1996 |
| WO | 03082573 A1 | 10/2003 |

\* cited by examiner

*Primary Examiner* — Steven B McAllister
*Assistant Examiner* — Brittany E Towns
(74) *Attorney, Agent, or Firm* — Rabin & Berdo, P.C.

(57) ABSTRACT

A tamper resistant enclosure for an electronic circuit includes an inner copper case, a tamper sensing mesh wrapped around the inner case, an outer copper case enclosing the inner case and the tamper sensing mesh, and a venting device forming a vent channel from inside the inner case to outside the outer case, the vent channel passing between overlapping layers of the tamper sensing mesh and having at least one right angle bend along its length. The venting device consists of two strips of a thin polyamide coverlay material laminated together along their length, and a length of wool yarn sandwiched between the two thin strips and extending from one end of the strips to the other end of the strips to form the vent channel. The length of yarn follows a zig-zag path between the first and second strips, the zig-zag path including at least one right angle bend.

18 Claims, 7 Drawing Sheets

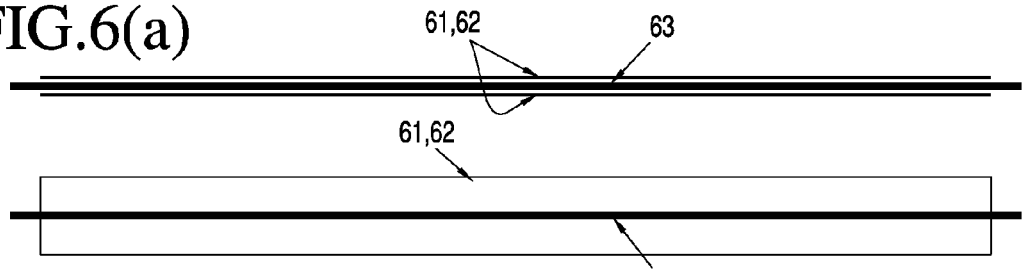
FIG.6(a)
FIG.6(b)
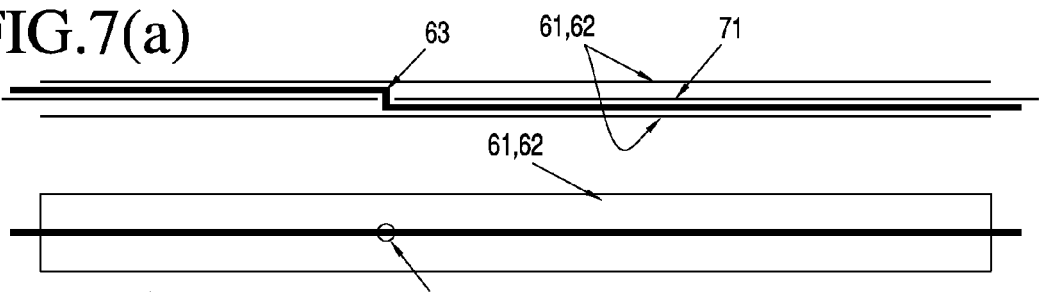
FIG.7(a)
FIG.7(b)
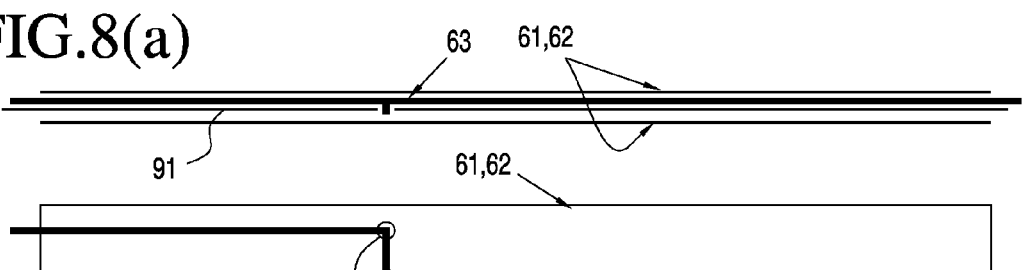
FIG.8(a)
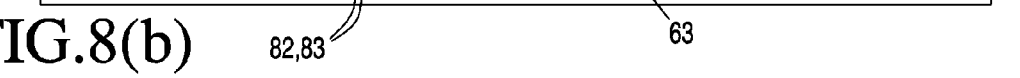
FIG.8(b)

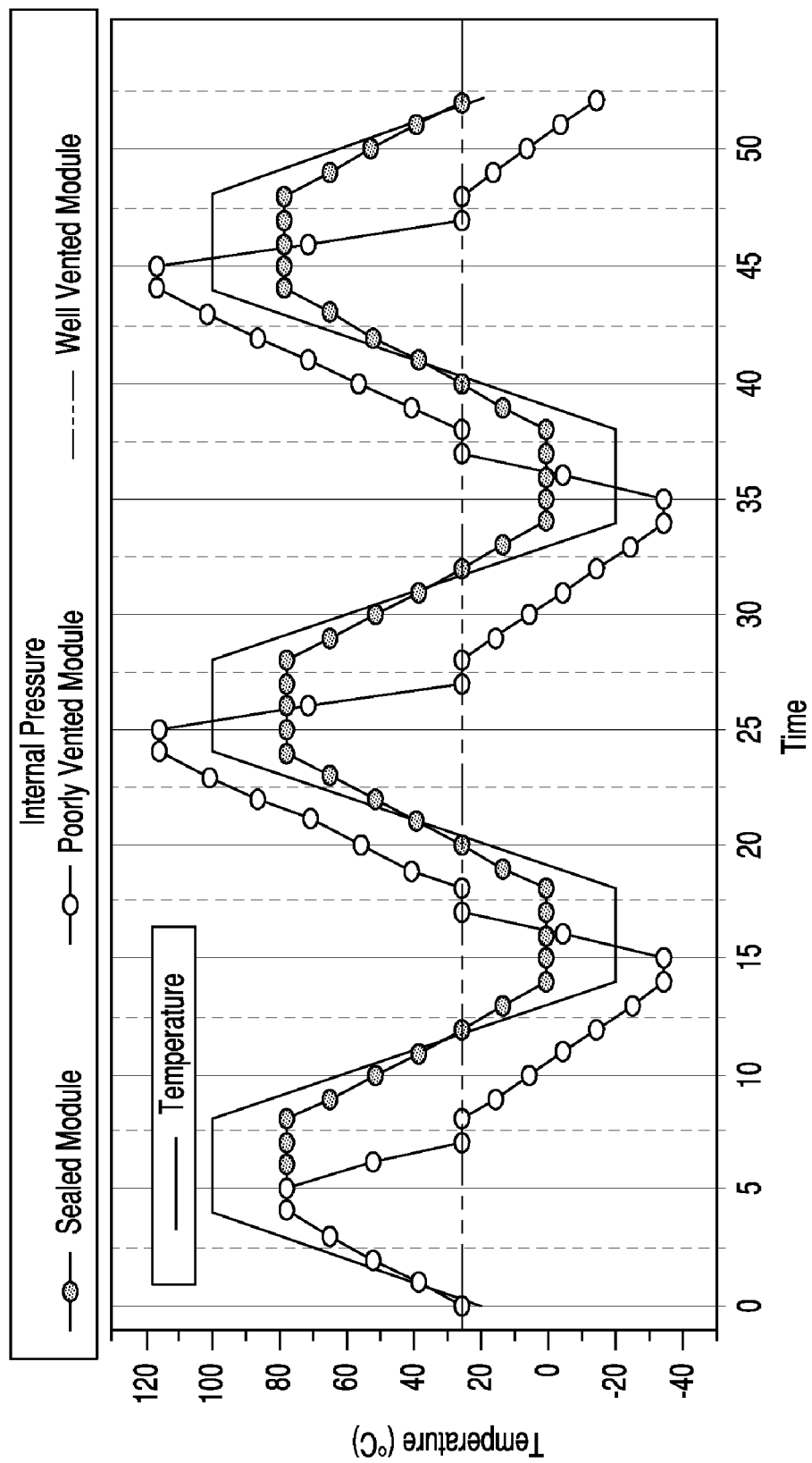

METHOD OF MANUFACTURING A VENTING DEVICE FOR TAMPER RESISTANT ELECTRONIC MODULES

CROSS REFERENCE TO RELATED APPLICATION

This patent application is a divisional application of patent application Ser. No. 10/981,021, filed on Nov. 4, 2004, now U.S. Pat. No. 7,214,874 B2, issued on May 8, 2007, which is incorporated herein by reference.

BACKGROUND OF THE INVENTION

1. Field of the Invention

This invention relates to a venting device for tamper resistant electronic modules, and more specifically to a venting device for electronic communications encryption modules that comply with Federal Information Processing Standards 140-2 (FIPS 140-2), Level 4, security requirements.

2. Background Information

Federal Information Processing Standards 140-2 (FIPS 140-2) is a standard that describes U.S. federal government requirements that IT products should meet for Sensitive, but Unclassified (SBU) use. The Standard was published by the National Institute of Standards and Technology (NIST) in May 2001, and succeeds FIPS 140-1 published by NIST in January 1994. It has been adopted by the Canadian government's Communication Security Establishment (CSE), and is likely to be adopted by the financial community through the American National Standards Institute (ANSI). This technology has become of particular interest in the wake of growing threats to security both at home and abroad.

The standard defines security requirements that must be satisfied by a cryptographic module used in a security system protecting unclassified information within IT systems. There are four levels of security: from Level 1 (lowest) to Level 4 (highest). These levels are intended to cover the wide range of potential applications and environments in which cryptographic modules may be deployed.

Security level 4 provides the highest level of security defined in the standard. At this security level, the physical security mechanisms provide a complete envelope of protection around the cryptographic module with the intent of detecting and responding to all unauthorized attempts at physical access. Penetration of the cryptographic module enclosure from any direction has a very high probability of being detected, resulting in the immediate nullification of all critical security parameters stored in the module. Security level 4 cryptographic modules are useful for operation in physically unprotected environments.

The principal features of a typical electronic communications encryption module designed to meet the requirements of FIPS 140-2, Level 4, are illustrated in the cross-sectional view of FIG. 1. At the heart of the encryption module is a circuit card 3 on which are mounted a number of integrated circuit chips (not shown) that provide the functionality of the encryption module. The circuit card 3 is enclosed in a copper inner case 2. Rivets 4 align the circuit card 3 and hold the cover of the inner case in place. The inner case 2 is wrapped in a tamper sensing resistive mesh 5. To assure complete coverage, the edges of the tamper sensing mesh 5 are overlapped on a portion 7 of the inner case 2. The inner case 2 wrapped in the mesh 5 is encapsulated with polyurethane 6, and the encapsulated assembly placed in a copper outer case 1. The complete enclosure is airtight.

FIG. 2 shows further details of the outside of inner case 2. Windows 12 are openings provided for flex cables connecting the circuit card 3 to a PCI printed circuit assembly or similar interface. Windows 22 are openings through which the tamper sensing mesh 5 will be connected to the circuit card 3.

FIG. 3a shows the encryption module at the stage where flex cables 31 are connected to the circuit board 3, and the mesh 5 is in the process of being wrapped around the inner case 2. As noted above, flex cables 31 connect the circuit card 3 to a PCI printed circuit assembly or similar interface through windows 12. Mesh cables 15 connect the tamper sensing resistive mesh 5 to the circuit card 3 through windows 22. This connection is illustrated in further detail in FIG. 3b. Through this connection, the circuit board 3 can sense when an attempt is made to gain access to the communications encryption module. If the tamper sensing resistive mesh 5 is damaged, the hardware on the circuit card 3 is programmed to nullify all of the encryption technology within the module.

The hermetically sealed assembly illustrated in FIGS. 1-3 has exhibited failure when exposed to reliability testing conditions that include temperature cycling, and when used in high temperature applications. FIGS. 4a-e show the sequence of events leading to mesh damage and failure. As temperature increases in FIG. 4a over room temperature, pressure of the trapped air 8 on the enclosing mesh 5 increases in accordance with the ideal gas law. This causes the mesh to tent in the vicinity of the window 22 through which the mesh enters the inner case 2, as shown in FIG. 4b. Air pressure and polyurethane expansion in the confined space, as shown in FIG. 4c, cause deformation of the copper outer case 1. Case deformation allows delamination between the primary layer and the overlap layer of the mesh 5, as shown in FIG. 4d. The mesh 5 can fail at this point or when, as shown in FIG. 4e, the case deformation is large enough that the mesh-to-mesh delamination reaches the mesh-to-polyurethane interface.

The use of a vent to relieve internal air pressure in the communications encryption module has been considered, but the concern is that even a small vent would allow access inside the enclosure and therefore violate FIPS 140-2, Level 4 requirements. Moreover it is believed that the manufacture of a tamper sensing resistive mesh allowing for such a vent would fail independent testing for FIPS compliance due the breach in protection of the package.

SUMMARY OF THE INVENTION

It is, therefore, a principle object of this invention to provide a venting device for tamper resistant electronic modules.

It is another object of the invention to provide a venting device for tamper resistant electronic modules that solves the above-mentioned problems.

These and other objects of the present invention are accomplished by the venting device for tamper resistant electronic modules that is disclosed herein.

In an exemplary aspect of the invention, a tamper resistant enclosure for an electronic circuit, designed to meet FIPS 140-2, Level 4, security requirements, includes an inner case for enclosing the electronic circuit, a tamper sensing mesh wrapped around the inner case in such a manner that edges of the tamper sensing mesh form overlapping layers on a portion of the inner case, an outer case enclosing the inner case and the tamper sensing mesh, and a venting device forming a vent channel from inside the inner case to outside the outer case, the vent channel passing between the overlapping layers of the tamper sensing mesh and having at least one right angle bend along its length. The inner case and the outer case are metallic and preferably made of copper. Further, an encapsulant, preferably made of a urethane material, fills the space between the inner case and the outer case.

In another aspect of the invention, the venting device is comprised of two strips of a thin material laminated together along their length, and a length of yarn sandwiched between the two thin strips and extending from one end of the strips to the other end of the strips to form a vent channel. In a preferred embodiment, the strips are composed of a polyamide coverlay material, and the yarn is a wool yarn. The venting device may also include a third strip of thin material interposed between the first and second thin strips, the third strip having one or more holes along its length through which the length of yarn is laced as it proceeds from one end of the venting device to the other. In an alternative embodiment, the length of yarn follows a zig-zag path between the first and second strips. Preferably, the zig-zag path includes at least one right angle bend.

In a further aspect of the invention, a method a manufacturing the subject venting device includes the steps of placing in a laminating press a sandwich comprising two strips of coverlay material each with a layer of thermally activated adhesive, and a length of wool yarn interposed between the two thin strips and extending from one end of the strips to the other end of the strips to form a vent channel, and laminating the two strips together with the yarn in between at elevated temperature and pressure for a predetermined period of time. For the preferred embodiment, the laminating process is performed at a temperature of approximately 300° F. and a pressure of approximately 75 PSI for a period of approximately 45 minutes. The method may further include layering sponge rubber on both sides of the sandwich before the laminating step, and employing in the laminating press platens having grooves that defines the vent channel. To manufacture the embodiment of the invention in which the vent channel follows a zig-zag path, the method preferably includes the steps of forming matching holes in the two strips of coverlay material and inserting pins through the matching holes to guide the length of yarn interposed between the two strips in a zig-zag path between one end of the strips and the other end of the strips.

BRIEF DESCRIPTION OF THE DRAWINGS

FIG. 6 shows a first embodiment of a venting device for an electronic communication encryption module according to the present invention.

FIG. 7 shows a second embodiment of a venting device for an electronic communication encryption module according to the present invention.

FIG. 8 shows a third embodiment of a venting device for an electronic communication encryption module according to the present invention.

FIG. 10 is a chart showing internal temperature and pressure versus time of sealed encryption modules with differing degrees of venting.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

The present invention is directed to a venting device suitable for tamper resistant electronic module that must meet FIPS 140-2 standards for communications encryption equipment. As discussed above, the tamper resistant encryption module typically consists of a circuit card with several integrated circuit devices and is mounted inside an inner metallic case with openings for flexcables. The flexcables are used to connect the card to a PCI printed circuit assembly or other suitable interface. To make the card tamperproof, an electronic shield in the form of a resistive mesh is wrapped around the inner can. The inner can is enclosed in an outer metallic can with the required polyurethane encapsulant filling the space between them. The whole assembly is heated to 80° C. using a specific temperature profile in order for the polyurethane to cure. During this manufacturing operation air gets entrapped in the inner case and has no way to escape. During operation of the card, the pressure developed by the trapped air is high enough to cause shear delamination and failure of the electronic shield over the flexcable openings in the inner case.

Figure 1:
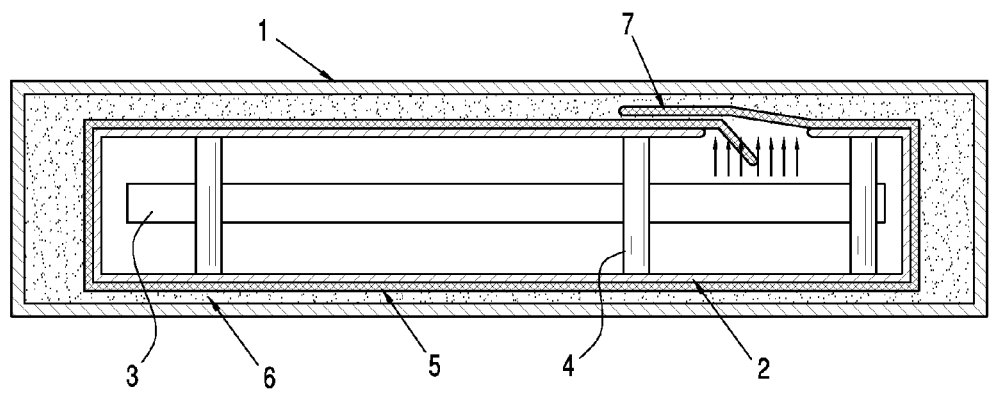
FIG. 1 is a simplified cross-sectional view of a typical electronic communications encryption module designed to meet the requirements of FIPS 140-2, Level 4.
Figure 2:
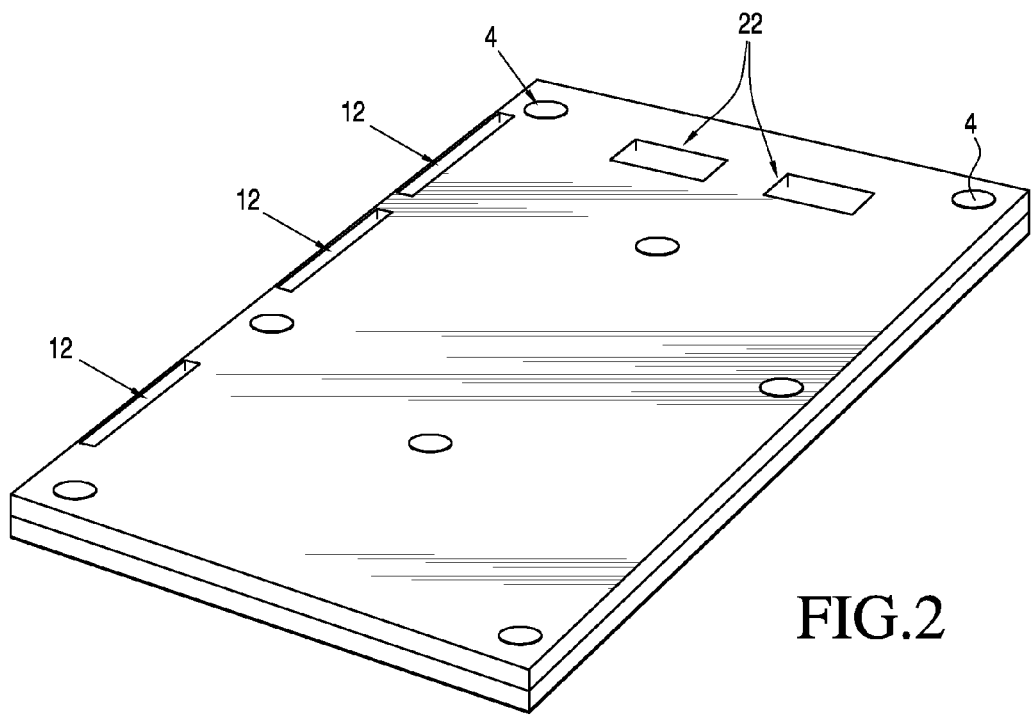
FIG. 2 is a perspective view showing details of the outside of the inner case of the encryption module of FIG. 1.
Figure 5:
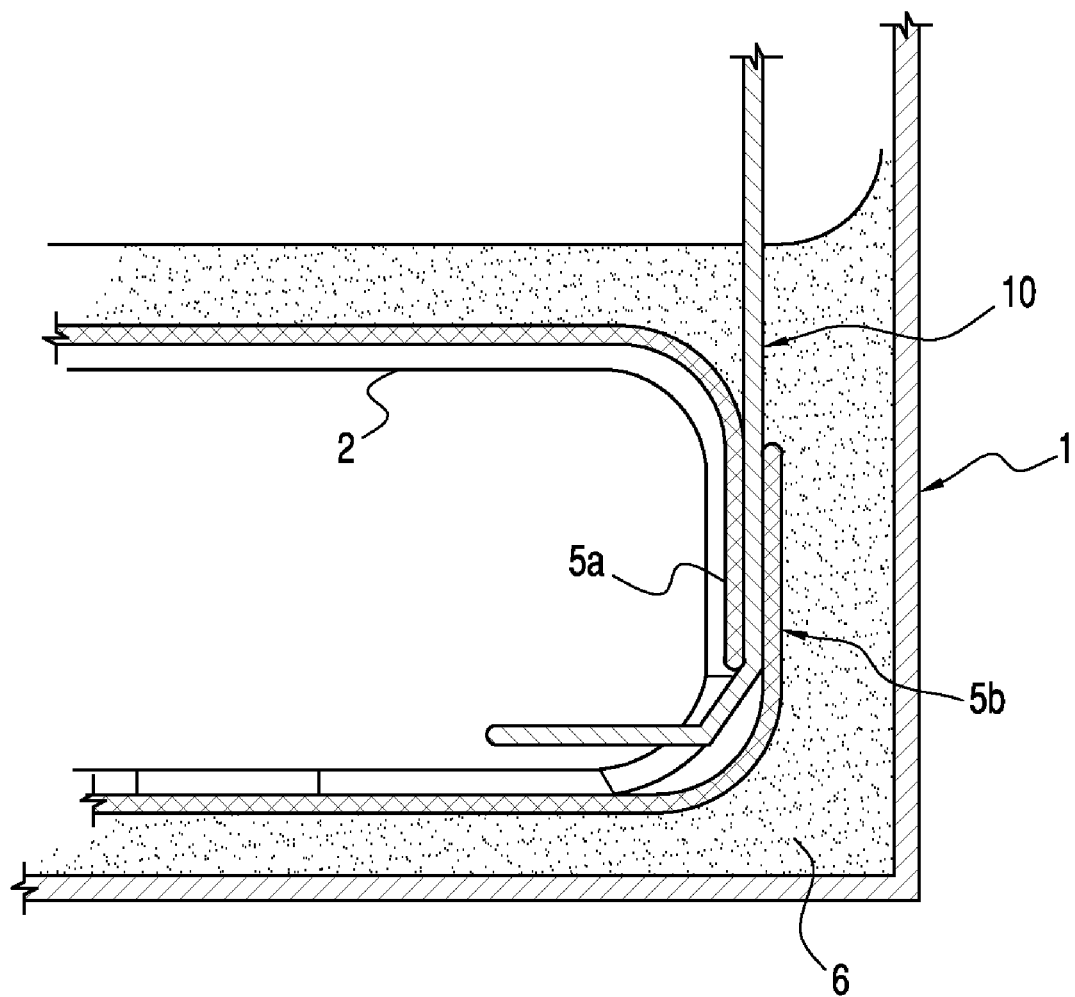
FIG. 5 is a cross-sectional view of an electronic communication encryption module illustrating the placement of a venting device according to the present invention.

FIG. 5 shows by way of example how a venting device can be added to the communications encryption module of FIG. 1 in a manner compliant with the FIPS 140-2, Level 4, standard. The venting device 10 passes through an opening in the inner case 2 where there are overlapping layers 5a, 5b of the tamper sensing mesh 5. The venting device 10 passes between the inner layer 5a, which is in contact with the inner case 2, and the outer layer 5b, which is wrapped over the venting device. In the example shown, there is a 90° bend in the venting device as it exits the inner case, in order to comply with a FIPS 140-2, Level 4, requirement that a standard vent tube have at least one 90° bend between the interior of the package and the exterior.

FIG. 6a-b show side and top views of a first embodiment of a venting device that employs no moving parts. In this embodiment, the vent consists of a channel formed between two strips 61,62 of a thin material that are laminated together along their length. The vent channel itself is defined by a length of yarn 63 sandwiched between the thin strips 61,62.

In this embodiment, the thin strips are made of a coverlay material, which is typically a polyimide or polyester material commonly used as a film applied to flexible printed circuits to protect and insulate the copper wiring. Other materials having similar properties can be substituted.

The yarn acts as a gas-permeable "semisolid" to prevent access to the inside of the module while allowing the passage of air so as to equalize the pressure in the interior of the inner case to the pressure on the exterior of the outer case. In this embodiment, the yarn consists of two lengths of four-ply wool yarn twisted together. Other types of yarns, such as glass yarn, can be substituted.

To make the venting device shown in this embodiment, the two strips of coverlay material, each 0.001 inch thick and each with a 0.001 inch layer of thermally activated adhesive, are laminated together in a standard flex circuit laminating press at approximately 300° F. and 70 PSI for a period of approximately 45 minutes. The yarn adheres to the coverlay due to the thermally activated adhesive. Sponge rubber or similar material is laid on both sides of the coverlay sandwich during the laminating process so as not to crush the yarn that forms the vent channel. To aid in the definition of the vent, the platens of the press could be made with a channel for the yarn.

As shown in FIG. 5, the venting device according to the first embodiment is inserted through an opening in the inner case 2, and passes between the overlapping layers of tamper sensing mesh 5 and through the polyurethane 6 between the inner and outer cases. A pressure sensitive adhesive is used to adhere the venting device to the first layer of mesh. In use, it is observed that a pressure differential of between 0 and 0.1 atmospheres must exist between the inside of the inner case and the outside of the outer case before air begins to flow between through the venting device. This threshold effect is attributed to the pressure that the cured urethane foam exerts on the sides of venting device.

A second embodiment of the venting device is illustrated in the side and top views of FIGS. 7a-b. In this alternate embodiment, another layer 71 of thin material, e.g., a 0.001-inch thick polyimide layer, is placed in the middle of the coverlay/yarn sandwich. A hole 72 is drilled in the polyimide layer and the yarn passes through the hole, passing from one side of the polyimide to the other side. By passing from one side of the polyimide the other side, two 90° of bends are formed in the vent channel. This satisfies the FIPS 140-2, Level 4, requirement for at least one 90° bend between the interior of the package and the exterior.

A third embodiment is shown in the side and top views of FIGS. 8a-b, where a third layer 81 of thin material is also used. However, in this case, two holes 82,83 are drilled in the third layer side-by-side, and the yarn is laced, first through one hole and then back through the other, to emerge on the same side. In this manner, six 90° bends are formed. Further alternative versions of the third embodiment are possible using different patterns of holes in the third layer of coverlay material.

Figure 9A:
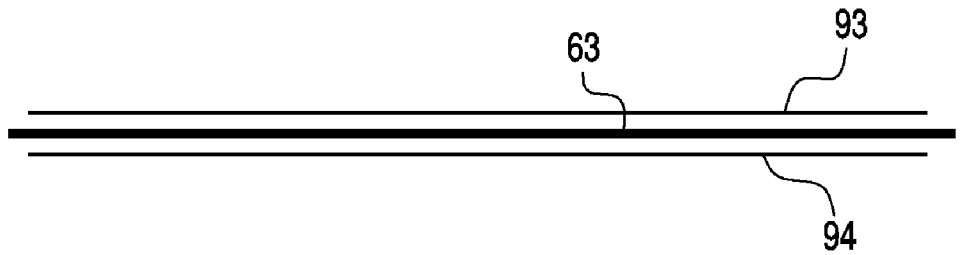
FIG. 9 shows a fourth embodiment of a venting device for an electronic communication encryption module according to the present invention.
Figure 9B:
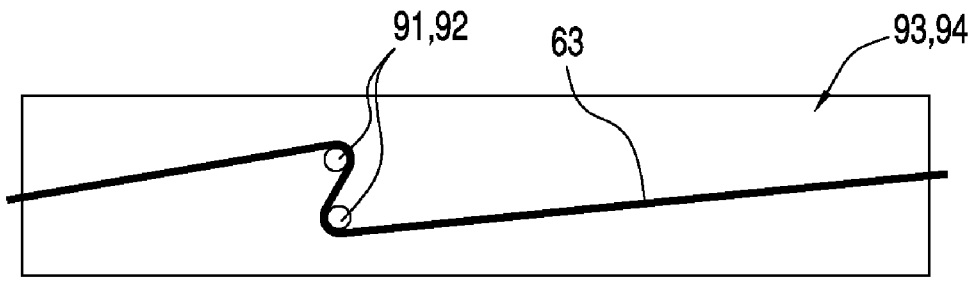
Figure 9C:
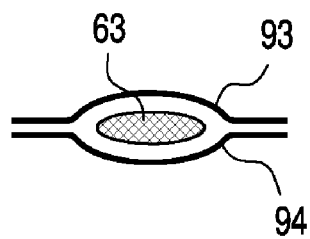

Moreover, it is possible to form the yarn vent channel in a zigzag pattern with any number of 90° bends, without using the third layer as a pattern. FIGS. 9a-9c illustrate side, top and transverse views, respectively, of a fourth embodiment in which small holes 91, 92 are formed in the coverlay strips 93,94 and pins (not shown) inserted in the holes to act as guides that cause the yarn material to change direction. Once the venting device is formed the pins are removed and the holes covered, such as with a thin acrylate label material (not shown), to prevent air from leaking out.

Figure 3A:
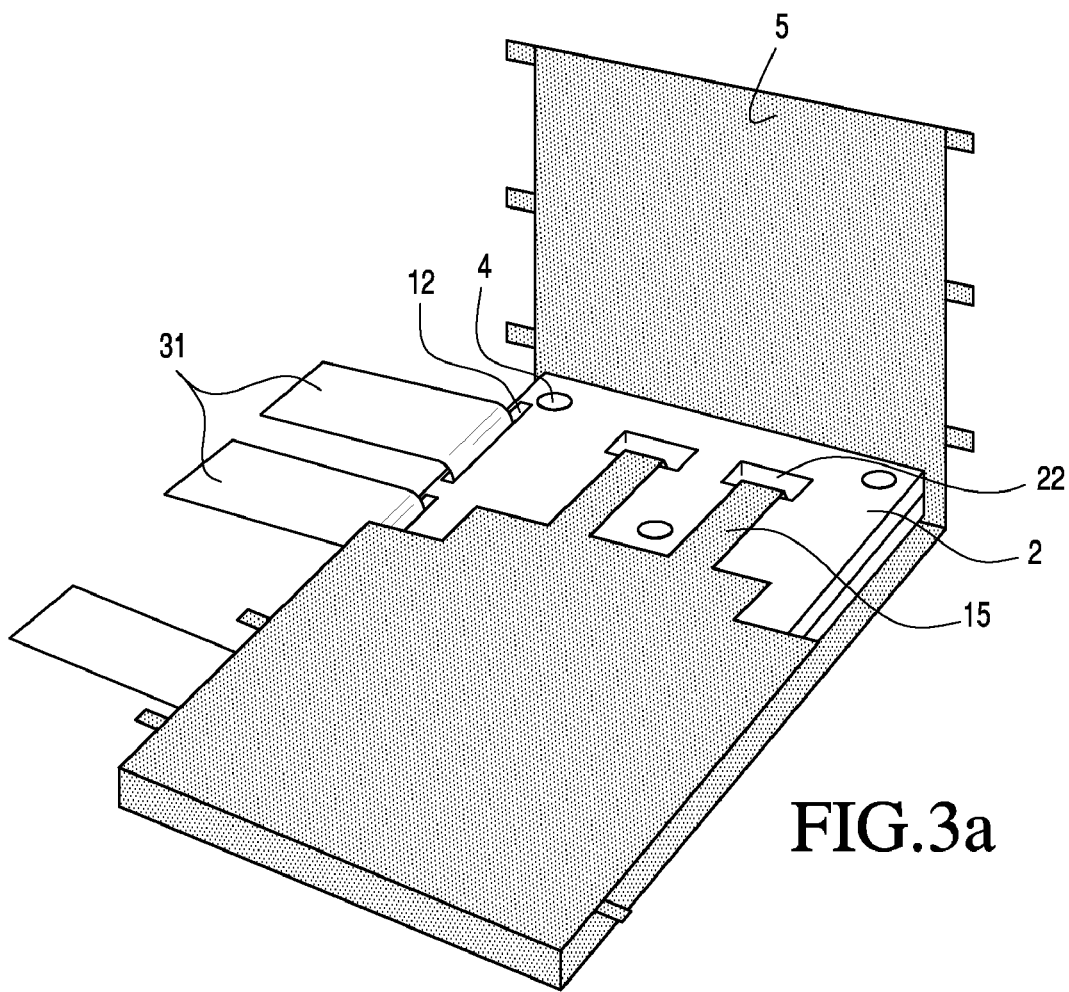
FIG. 3a is a perspective view showing the inner case of the encryption module being wrapped in a tamper sensing resistive mesh.
Figure 3B:
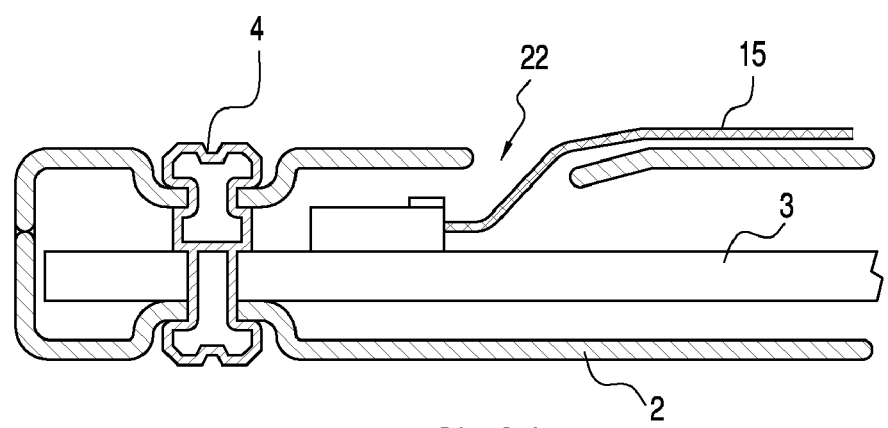
FIG. 3b is a simplified cross-sectional view showing the connection of the tamper sensing resistive mesh to the circuit card located within the inner case of the encryption module.
Figure 4A:
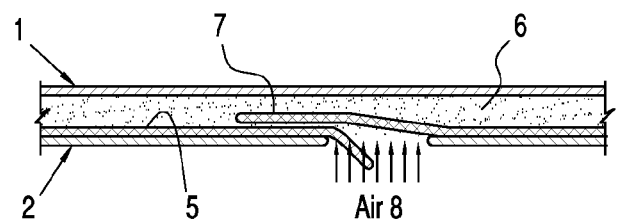
FIGS. 4a-4e are a series of simplified cross-sectional views illustrating a failure mechanism of the tamper sensing resistive mesh at elevated temperatures due to air trapped within the inner case of the encryption module.
Figure 4B:
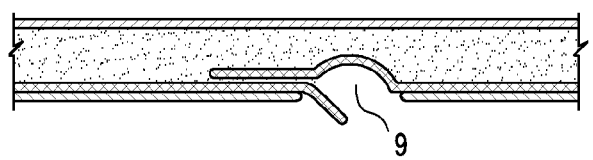
Figure 4C:
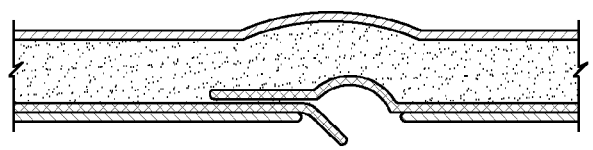
Figure 4D:
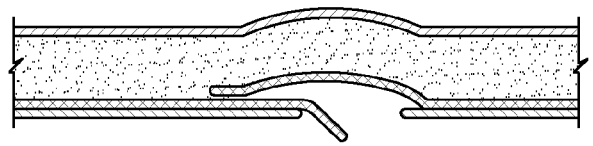
Figure 4E:
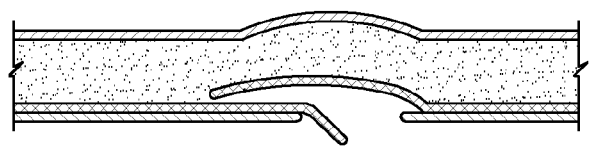

In the venting device of the foregoing embodiments, the coverlay adhesive not only holds the package together but also serves to hold the yarn in place so that it cannot be pushed out of the way. Because of the many layers of fiber within the yarn, the adhesive also serves to keep the yarn together as a unit. The coverlay itself is fragile and any attempts to follow the vent channel through the yarn will damage the coverlay. When the coverlay is damaged, it gives direct access to damage of the tamper sensitive resistive mesh. If the tamper sensitive resistive mesh is damaged, the circuitry inside the package is programmed to nullify all the encryption technology within the module. Fragile tamper circuitry can be added to the coverlay itself around the vent channel and this can also be monitored by the module to detect any attempts to gain access to the encryption technology. As another alternative, the vent can be made an integral part of the flex cables 31 shown in FIG. 3.

As can be seen in FIG. 5, the venting device has a primary 90° bend in the mesh. FIGS. 7-9 show how further 90° bends can be added as desired to make access into the package more difficult. These extra 90° bends should be made between the layers of mesh for the most optimum function. By being between the layers of mesh, they increase the level of tamper resistance and tamper detection by the module. If required, multiple vents can be added to the module, or multiple channels can be made in one venting device.

Because of the air resistance of the vent channel, the venting process will take a period of time. The optimum venting time is either much less than or somewhat more than one-quarter the period of the thermal cycle to which the module is exposed. As shown in FIG. 10, the worst case occurs when the venting time is equal to one-quarter of the cycling time. This creates higher peak pressures at high temperatures and lower low pressures at low temperatures. Accordingly, the vent time needs to the optimized to avoid this condition.

Some embodiments of the present invention may further include a check valve or the like, either in the vent channel or in a separate duct. The check valve in these embodiments should both actuate at a relatively low pressure (e.g., around 0.01 atm) and be sufficiently limited in valve travel so as to prevent introduction, either intentional or accidental, of foreign materials. These embodiments may be desirable where a high flow rate through the vent channel is required.

It should be understood that the invention is not necessarily limited to the specific process, arrangement, materials and components shown and described above, but may be susceptible to numerous variations within the scope of the invention. For example, although the above-described exemplary aspects of the invention are believed to be particularly well suited for tamper resistant communications encryption modules, it is contemplated that the concepts of the present invention can be utilized whenever it is desired to vent any tamper resistant electronic assembly.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes and adaptations, and the same are intended to be comprehended within the meaning and range of equivalents of the appended claims.

What is claimed is:

1. A method of manufacturing a venting device for a tamper resistant enclosure, comprising:
providing two strips of coverlay material each with a layer of thermally activated adhesive, the coverlay material being gas-impermeable;
providing a length of gas-permeable semisolid material interposed between the two strips and extending from one end of the strips to the other end of the strips; wherein the gas-permeable semi-solid material is a fibrous yarn laminating the two strips together in a sandwich with the gas-permeable semisolid material in between at elevated temperature and pressure for a predetermined period of time, so as to form a vent channel between the strips, the vent channel allowing a gas to flow therethrough from the one end of the strips to the other end of the strips; and the length of the gas-permeable semisolid material is guided along a zig-zag path between one end of the strips and the other end of the strips.

2. The method of claim 1, wherein the laminating of the two strips together with the gas permeable semisolid material in between is performed at a temperature of approximately 300° F. and a pressure of approximately 70 PSI for a period of approximately 45 minutes.

3. The method of claim 1, wherein the laminating step is performed in a laminating press with sponge rubber layered on both sides of the sandwich comprised of the two strips of coverlay material and the length of gas permeable semisolid material in between.

4. The method of claim 1, wherein the laminating step is performed in a laminating press having platens with grooves that define the vent channel.

5. The method of claim 1, further comprising:
forming matching holes in the two strips of coverlay material and inserting pins through the matching holes to guide the length of gas permeable semisolid material interposed between the two strips in the zig-zag path between one end of the strips and the other end of the strips.

6. The method of claim 1, wherein the yarn is a wool yarn.

7. The method of claim 1, further comprising:
inserting a check valve in the vent channel.

8. The method of claim 1, wherein the zig-zag path includes at least one right angle bend.

9. The method of claim 1, wherein the coverlay material is composed of a polyimide.

10. The method of claim 1, wherein the coverlay material is air-impermeable.

11. The method of claim 1, wherein the gas-permeable semisolid material is air-permeable.

12. The method of claim 1, wherein the gas-permeable semisolid is in direct contact with both of the two strips of coverlay material.

13. The method of claim 1, wherein the vent channel has at least one right angle bend.

14. A method of manufacturing a venting device for a tamper resistant enclosure, comprising:
providing two strips of gas-impermeable coverlay material each with a layer of thermally activated adhesive;
providing a length of gas-permeable semisolid material interposed between the two strips and extending from one end of the strips to the other end of the strips;
laminating the two strips together in a sandwich with the gas-permeable semisolid material in between at elevated temperature and pressure for a predetermined period of time, so as to form a vent channel between the strips, the vent channel allowing a gas to flow therethrough from the one end of the strips to the other end of the strips; and
forming matching holes in the two strips of coverlay material and inserting pins through the matching holes to guide the length of gas permeable semisolid material interposed between the two strips in a zig-zag path between one end of the strips and the other end of the strips.

15. Method of claim 14, further comprising:
after the length of gas permeable semisolid material is guided with the pins and the holes, removing the pins and covering the holes so as to prevent air from leaking out.

16. The method of claim 14, wherein the coverlay material is composed of a polyimide.

17. The method of claim 14, wherein the coverlay material is composed of a polyester material.

18. The method of claim 1, wherein the coverlay material is composed of a polyester material.

* * * * *

UNITED STATES PATENT AND TRADEMARK OFFICE
CERTIFICATE OF CORRECTION

Page 1 of 1

PATENT NO. : 8,287,336 B2
APPLICATION NO. : 11/686102
DATED : October 16, 2012
INVENTOR(S) : Dangler et al.

It is certified that error appears in the above-identified patent and that said Letters Patent is hereby corrected as shown below:

On the title page item [56], col. 2 line 11,

References Cited, under U.S. PATENT DOCUMENTS, insert

-- 5,529,830   6/1996   Dutta et al. --

Signed and Sealed this
Sixth Day of October, 2015

Michelle K. Lee
*Director of the United States Patent and Trademark Office*